US007797140B2

(12) United States Patent
Lee et al.

(10) Patent No.: US 7,797,140 B2
(45) Date of Patent: Sep. 14, 2010

(54) GENERALIZATIONS OF ADJOINT NETWORKS TECHNIQUES FOR RLC INTERCONNECTS MODEL-ORDER REDUCTIONS

(75) Inventors: Herng-Jer Lee, Tao-Yuan (TW);
Chia-Chi Chu, Tao-Yuan (TW);
Wu-Shiung Feng, Tao-Yuan (TW);
Ming-Hong Lai, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 377 days.

(21) Appl. No.: 10/982,668

(22) Filed: Nov. 5, 2004

(65) Prior Publication Data
US 2006/0100831 A1    May 11, 2006

(51) Int. Cl.
G06F 7/60      (2006.01)
G06F 17/10     (2006.01)
(52) U.S. Cl. ............................................ 703/2; 703/13
(58) Field of Classification Search ...................... 703/2, 703/13
See application file for complete search history.

(56) References Cited

U.S. PATENT DOCUMENTS

| | | | |
|---|---|---|---|
| 5,920,484 | A | 7/1999 | Nguyen et al. |
| 6,023,573 | A | 2/2000 | Bai et al. |
| 6,041,170 | A | 3/2000 | Feldmann et al. |
| 6,687,658 | B1 | 2/2004 | Roychowdhury |

OTHER PUBLICATIONS

"Generalizations of Adjoint Networks Techniques for RLC Interconnects Model-Order Reductions" Lee et al. ISCAS, May 2004.*

Freund, "Krylov Subspace methods for Reduced Order Modeling in Circuit Simulation", Nov. 1999.*

S. Y. Kim, N. Copal, L. T. Pillage, "Time-Domain Macromodels for VLSI Interconnect Analysis," IEEE Trans. on Computer-Aided Design of Integrated Circuits and Systems, vol. 13, No. 10, pp. 1257-1270, 1994.

L. T. Pillage, R. A. Rohrer, "Asymptotic Waveform Evaluation for Timing Analysis," IEEE Trans. on Computer-Aided Design of Integrated Circuits and Systems, vol. 9, No. 4, pp. 352-366, 1990.

P. Feldmann, R. W. Freund, "Efficient Linear Circuit Analysis by Pade Approximation Via the Lanczos Process," IEEE Trans. on Computer-Aided Design of Integrated Circuits and Systems, vol. 14, No. 5, pp. 639-649, 1995.

P. Feldmann, R. W. Freund, "The SyMPVL Algorithm and its Applications to Interconnect Analysis," Proc. 1997 International Conference on Simulation of Semiconductor Processes and Devices, pp. 113-116, 1997.

A. Odabasioglu, M. Celik, L. T. Pilegi, "PRIMA: Passive Reduced-Ordered Interconnect Macromodeling Algorithm," IEEE Trans. on Computer-Aided Design of Integrated Circuits and Systems, vol. 17, No. 8, pp. 645-653, 1998.

(Continued)

*Primary Examiner*—Kamini S Shah
*Assistant Examiner*—Saif A Alhija

(57) ABSTRACT

The adjoint network reduction technique has been shown to reduce 50% of the computational complexity of constructing the congruence transformation matrix. The method was suitable for analyzing the special multi-port driving-point impedance of RLC interconnect circuits. This technique is extended for the general circumstances of RLC interconnects. Comparative studies among the conventional methods and the proposed methods are also investigated. Experimental results will demonstrate the accuracy and the efficiency of the proposed method.

2 Claims, 3 Drawing Sheets

OTHER PUBLICATIONS

J. M. Wang, C. C. Chu, Q. Yu, E. S. Khu, "On Projection Based Algorithms for Model Order Reduction of Interconnects," IEEE Trans. on Circuits and Systems—I: Fundamental Theory and Applications, vol. 49, No. 11, pp. 1563-1585, 2002.

Qingjian Yu, Janet Meiling L. Wang, Ernest S. Kuh, "Passive Multipoint Moment Matching Model Order Reduction Algorithm on Multiport Distributed Interconnect Networks," IEEE Trans. on Circuits and Systems—I: Fundamental Theory and Applications, Jan. 1999, pp. 140-160, vol. 46, No. 1.

* cited by examiner

GENERALIZATIONS OF ADJOINT NETWORKS TECHNIQUES FOR RLC INTERCONNECTS MODEL-ORDER REDUCTIONS

BACKGROUND OF THE INVENTION

1. Field of the Invention

The present invention relates to generalizations of adjoint networks techniques and, more particularly, to generalizations of adjoint networks techniques for RLC interconnects model-order reductions.

2. Description of Related Art

With the advances in deep submicron semiconductor techniques, the parasitic effects of interconnects can no longer be ignored. To completely characterize the signal integrity issues, interconnects are often modeled as large RLC networks. To this end, in order to reduce the computational time of the large-scale RLC interconnect networks, model-order reduction methods have emerged recently.

A consensus has emerged that of the many model-order reduction techniques, the moment matching approach, or the so-called Krylov subspace projection method, seems to be the most viable one. In general, these methods can be divided into two categories: one-sided projection methods and two-sided projection methods. The one-sided projection methods use the congruence transformation to generate passive reduced-order models, while the two-sided ones can not be guaranteed. In recent works, the adjoint network reduction technique has been proposed to further reduce the cost about yielding the congruence transformation matrix. The method was suitable for analyzing the special multi-port driving-point impedance of RLC interconnect circuits.

The purpose of the present invention is to extend the adjoint network technique for general RLC interconnect networks. First, relationships between an original MNA network and its corresponding adjoint MNA network are explored. Second, the congruence transformation matrix can be constructed by using the resultant biorthogonal bases from the Lanczos-type algorithms. Therefore, less storage and computational complexity are required in the technique of the present invention.

SUMMARY OF THE INVENTION

The main objective of the present invention is to provide improved generalizations of adjoint networks techniques for RLC interconnects model-order reductions.

The adjoint network reduction technique has been shown to reduce 50% of the computational complexity of constructing the congruence transformation matrix. The method was suitable for analyzing the special multi-port driving-point impedance of RLC interconnect circuits. This technique has been extended for the general circumstances of RLC interconnects. Comparative studies among the conventional methods and the proposed methods are also investigated. Experimental results will demonstrate the accuracy and the efficiency of the proposed method.

Further benefits and advantages of the present invention will become apparent after a careful reading of the detailed description with appropriate reference to the accompanying drawings.

DETAILED DESCRIPTION OF THE INVENTION

Figure 1:
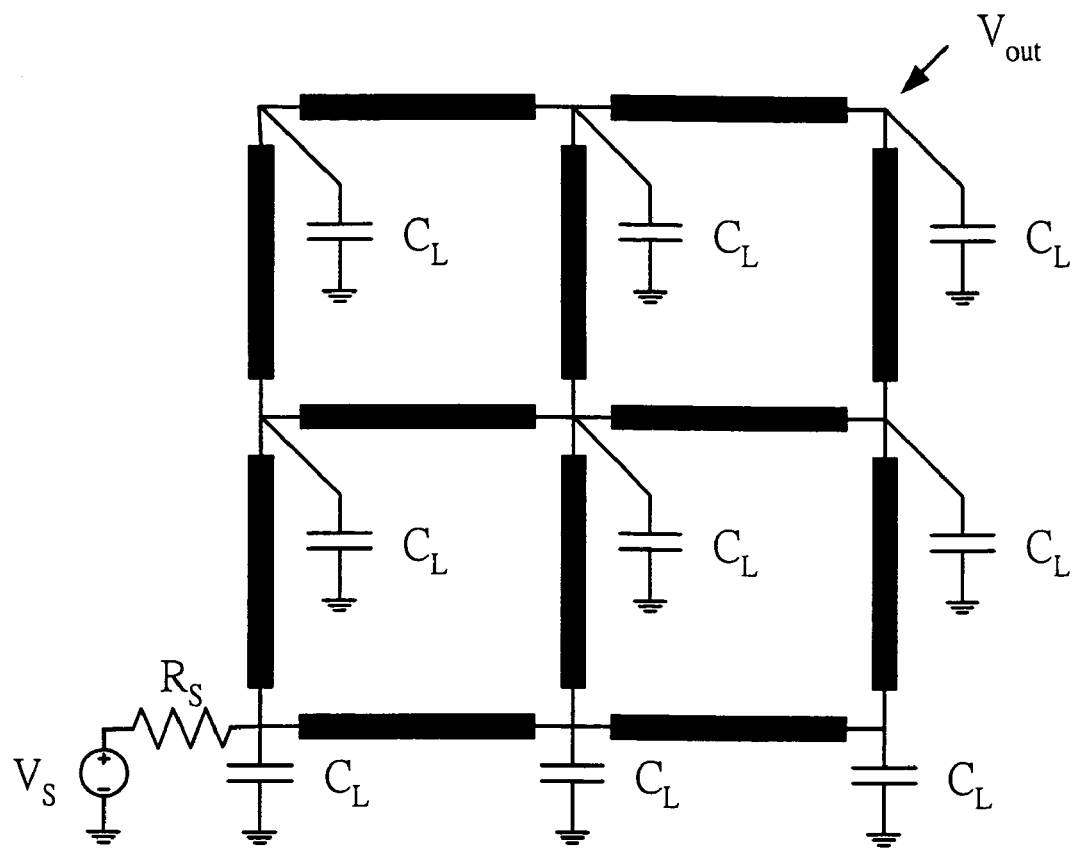
FIG. 1 is a mech circuit diagram.

The dynamics of RLC interconnect networks can be represented by the following modified nodal analysis (MNA) formulae:

$$M\frac{dx(t)}{dt} = -Nx(t) + Bu(t), \quad y(t) = D^T x(t) \quad (1)$$

where $$M = \begin{bmatrix} C & 0 \\ 0 & L \end{bmatrix}, \quad N = \begin{bmatrix} G & E \\ -E^T & R \end{bmatrix}, \quad x(t) = \begin{bmatrix} v(t) \\ i(t) \end{bmatrix},$$

$x(t) \in R^n$ is the state vector, $u(t) \in R^m$ is the input vector, $y(t) \in R^p$ is the output vector, and $M, N \in R^{n \times n}$, $B \in R^{n \times m}$, and $D \in R^{n \times p}$ are so-called the MNA matrices. M and N containing capacitances in C, inductances in L, conductances in G and resistances in R are positive definite, M is symmetric and N is non-symmetric. E presents the incident matrix for satifying Kirchhoff's current law. $x(t)$ contains node voltages $V(t) \in R^{n_v}$ and branch currents of inductors $i(t) \in R^{n_i}$, where $n = n_v + n_i$. If the m-port driving-point impedance is concerned, then $p = m$ and $D = B$.

Let the signature matrix be defined as $S = \text{diag}(I_{n_v}, -I_{n_i})$ so that the symmetric properties of the MNA matrices are as follows:

$$S^{-1} = S, SMS = M, \text{ and } SNS = N^T \quad (2)$$

Under this situation, if port driving-point impedance is concerned, that is, each port is connected with a current source, then $B^T = [B_v^T 0]$, where $B_v \in R^{n_v \times m}$, and $SB = B$.

The transfer functions of the state variables and of the outputs are defined as $X(s) = (n+sM)^{-1}$ and $Y(s) = D^T X(s)$. Given a frequency $s_0 \in C$, let $A = -(N+s_0 M)^{-1} M$ and $R = (N+s_0 M)^{-1} B$, where $N + s_0 M$ is assumed nonsingular. The Taylor series expansion of $X(s)$ about $s_0$ is given by $$X(s) = \sum_{i=0}^{\infty} X^{(i)}(s_0)(s - s_0),$$

where $$X^{(i)}(s_0) = A^i R$$

is the ith-order system moment about $s_0$. Similarly, the ith-order output moment about $s_0$ is calculated as $Y^{(i)}(s_0) = D^T X^{(i)}(s_0)$.

Suppose that the above system is large-scale and sparse. The model-order reduction problem is to seek a q-order system, where $q \ll n$, such that $$\hat{M}\frac{d\hat{x}(t)}{dt} = -\hat{N}\hat{x}(t) + \hat{B}u(t), \quad \hat{y}(t) = \hat{D}^T \hat{x}(t) \quad (3)$$

where $\hat{x}(t) \in R^q, \hat{M}, \hat{N} \in R^{q \times m}, \hat{B} \in R^{q \times m}$, and $\hat{D} \in R^{q \times p}$. The corresponding ith-order system moment and output moment about $s_0$ is $\hat{X}^{(i)}(s_0) = (-(\hat{N}+s_0 \hat{M})^{-1}\hat{M})^i(\hat{N}+s_0 \hat{M})^{-1}\hat{B}$ and $\hat{Y}^{(i)}(s_0) = \hat{D}^T \hat{X}^{(i)}(s_0)$. The purpose of the moment matching is to construct a reduced-order system such that $\hat{Y}^{(i)}(s_0)=Y^{(i)}(s_0)$ for $0\leq i\leq k-1$, where k is the order of moment matching.

One conventional solution for moment matching is using the one-sided Krylov subspace projection method. The kth-order block Krylov subspace is defined as $K(A,R,k)=\text{colsp}([RAR\ldots A^{k-1}R])$. $K(A,R,k)$ is indeed the subspace spanned by $X^{(i)}(s_0)$ for $0\leq i\leq k-1$. The projection can be achieved by constructing $V_q \in R^{n\times q}$, $q\leq km$, from the Krylov subspace $K(A,R,k)$. Under this framework, we have $x(t)=V_q\hat{x}_q(t)$ and the reduced-order model can be expressed as $$\hat{M}=V_q^T M V_q, \hat{N}=V_q^T N V_q, \hat{B}=V_q^T B, \hat{D}=V_q^T D \tag{4}$$

It has been shown that $X^{(i)}(s_0)=V_q\hat{X}^{(i)}(s_0)$ and $\hat{Y}^{(i)}(s_0)=Y^{(i)}(s_0)$ for $0\leq i\leq k-1$. The reduced-order model is guaranteed stable $\hat{M}$ and $\hat{N}$ are positive definite. Furthermore, it will be passive if the multi-port driving-point impedance is concerned.

Two types of algorithms can be employed to generate $V_q$ from the Krylov subspace: the Arnoldi type and the Lanczos type. We use the notation $V_{q(A)}$ to denote the orthonormal basis generated from the block Arnoldi algorithm from the Krylov subspace $K(A,R,k)$. Similarly, we use the notation $V_{q(L)}$ and $W_{q(L)}$ to represent the biorthogonal bases yielded from the block Lanczos algorithm from the Krylov subspaces $K(A,R,k)$ and $K(A^T,D,k)$, respectively. In this case, $W_{q(L)}^T V_{q(L)} = \Delta_q$, where $\Delta_q$ is a full rank diagonal matrix. In the past, either $V_{q(A)}$ or $V_{q(L)}$ has been used to generate the reduced-order model (4).

Traditionally, $W_{q(L)}$ and $V_{q(L)}$ are used to perform oblique projection $$\hat{M}=-W_{q(L)}^T A V_{q(L)}, \hat{N}=W_{q(L)}^T(I+s_0A)V_{q(L)}, \hat{B}=W_{qT(L)}^T R,$$
$$\hat{D}=V_{q(L)}^T D$$

Although the reduced-order system can match up to 2k-order moments, this model can not be guaranteed to be stable and passive. Variations of the Lanczos-type algorithms have also been proposed. For example, if the m-port driving-point impedance is concerned (D=B), the symmetric block Lanczos algorithm has been investigated. In this case, $W_q=D_q V_{q(L)}$, where $D_q$ is a diagonal matrix, only a half of the computational cost and storage are required.

Using both $W_{q(L)}$ and $V_{q(L)}$ in the one-sided projection method is still possible. It can be achieved by the adjoint network reduction technique. The details can be developed in the following section.

One technique for model-order reductions is tot apply the corresponding adjoint MNA formulae. The adjoint network (or the dual system) of the system (1) is represented as:

$$M\frac{dx_a(t)}{dt}=-N^T x_a(t)+Du(t), \ y_a(t)=B^T x_a(t) \tag{5}$$

The system transfer function and its ith-order system moment about $s_0$ are defined as $X_a(s)=(N^T+sM)^{-1}D$ and $X_a^{(i)}(s_0)$, respectively. By using the information of $X_a^{(i)}(s_0)$, the following theorem has been shown:

Theorem 1: If a matrix U is chosen as the congruence transformation matrix such that $$\{X^{(i)}(s_0), X_a^{(j)}(s_0)\}\in\text{colsp}(U) \text{ for } 0\leq i\leq k-1 \text{ and } 0\leq j\leq l-1, \tag{6}$$

then $\hat{Y}^{(i)}(s_0)=Y^{(i)}(s_0)$ for $0\leq i\leq k+l-1$.

The technique can overcome the numerical instability problem when generating the basis matrix U if order k+l is extremely high. In this section, we summarize some properties of the adjoint network reduction technique. Relationships between $X_a^{(i)}(s_0)$ and $X^{(i)}(s_0)$ are derived explicitly. It can be contributed to reduce the computational cost of constructing U.

This subsection will show that the congruence transformation matrix U can be constructed with the resultant biorthogonal bases $V_{qL}$ and $W_{qL}$ from the Lanczos-type algorithms. The theorems will be disclosed as below.

The theorems will be disclosed as below.

By changing the state variables: $x_a(t)=(N^T+s_0M)^{-1}z_a(t)$. Equation (5) can be rewritten as $$M(N^T+s_0M)^{-1}\frac{dz_a(t)}{dt}=-N^T(N^T+s_0M)^{-1}z_a(t)+Du,$$
$$y_a(t)=B^T(N^T+s_0M)^{-1}z_a(t).$$

The corresponding system transfer function is $$Z_a(s)=(N^T+s_0M)(N^T+sM)^{-1}D=(N^T+s_0M)X_a(s).$$

Thus the ith-order system moments of $Z_a(s)$ and $X_a(s)$ about $s_0$ can be derived as follows:

$$Z_a^{(i)}(s_0)=(N^T+s_0M)X_a^{(i)}(s_0) \tag{7}$$

Through the introduction of $Z_a^{(i)}(s_0)$, the relationships between $X_a^{(i)}(s_0)$ and $W_{q(L)}$ are observed in the following lemma.

Lemma 1: Suppose that $K(A^T,D,k)=\text{colsp}(W_{q(L)})$. We have $$Z_a^{(i)}(s_0)\in\text{colsp}(W_{q(L)}), \tag{8}$$

$$X_a^{(i)}(s_0)\in\text{colsp}((N^T+s_0M)^{-1}W_{q(L)}), \tag{9}$$

for $0\leq i\leq k-1$.

Proof: First, from (7), we have $$Z_a^{(i)}(s_0)=(N^T+s_0M)\left[-(N^T+s_0M)^{-1}M\right]^i(N^T+s_0M)D$$
$$=\left[-M(N^T+s_0M)^{-1}\right]^i D$$
$$=(A^T)^i D.$$

Thus $$\text{colsp}([Z_a^{(0)}(s_0) Z_a^{(1)}(s_0) \ldots Z_a^{(k-1)}(s_0)])=K(A^T,D,k)=\text{colsp}(W_{q(L)}).$$

Second, the above result implies that $Z_a^{(i)}(S_0)=W_{q(L)}\hat{Z}_a^{(i)}(s_0)$ for $0\leq i\leq k-1$. Thus (9) can be proven as below:

$$X_a^{(i)}(s_0)=(N^T+s_0M)^{-1}W_{q(L)}\hat{Z}_a^{(i)}(S_0),$$

for $0\leq i\leq k-1$. Each $X_a^{(i)}(s_0)$ exists in the subspace spanned by columns of $(N^T+S_0M)^{-1}W_{q(L)}$. This completes the proof.

Theorem 2: Suppose that $X^{(i)}(s_0)\in\text{colsp}(V_{q(L)})$, for $0\leq i\leq k-1$, is a set of moments of x(s) about $s_0$. $X_a^{(i)}(s_0)\in\text{colsp}((N^T+s_0M)^{-1}W_{q(L)})$ for $0\leq i\leq k-1$. Suppose that $V_{q(L)}$ and $W_{q(L)}$ are biorthogonal matrices generated by the block Lanczos algorithm. Let $U=[V_q(N^T+s_0M)^{-1}W_q]$ be the congruence transformation matrix for model-order reductions in (4), then $$\hat{Y}(s_0)=Y^{(i)}(s_0), \text{ for } 0\leq i\leq 2k-1, \tag{10}$$

Proof: From the projection theory in Section 2 and Lemma 1, we have $$X^{(i)}(s_0)=U\hat{X}^{(i)}(s_0), \text{ for } 0 \leq i \leq k-1,$$

and $$X_a^{(i)}(s_0)=U\hat{X}_a^{(i)}(s_0), \text{ for } 0 \leq i \leq k-1.$$

Then the result can be shown by Theorem 1.

Theorem 2 demonstrates that a stable reduced-order model for general RLC circuits can be generated by the Lanczos-type algorithms. Moreover, 2k-order output moments are matched by performing k iterations of the algorithm.

Theorem 3: Suppose that $X^{(i)}(s_0) \in \text{colsp}(V_{q(A)})$ for $0 \leq i \leq k-1$ is a set of moments of $X_{(s)}$ about $s_0$. $V_{q(A)}$ is the orthonormal matrix generated by the block Arnoldi algorithm. Let $U=[V_{q(A)}SV_{q(A)}]$ be the congruence transformation matrix for model-order reductions in (4), then $$\hat{Y}^{(i)}(s_0)=Y^{(i)}(s_0), \text{ for } 0 \leq i \leq 2k-1 \quad (11)$$

Proof: Let P be a q×n diagonal matrix. Since $W_{q(L)}=P(N^T+s_0M)V_{q(L)}$ and $V_{q(L)}=V_{q(A)}$, it can be shown that the subspace spanned by $U=[V_{q(A)}SV_{q(A)}]$ and $U=[V_{q(L)}(N^T+s_0M)^{-1}W_{q(L)}]$ are the same.

Figure 2:
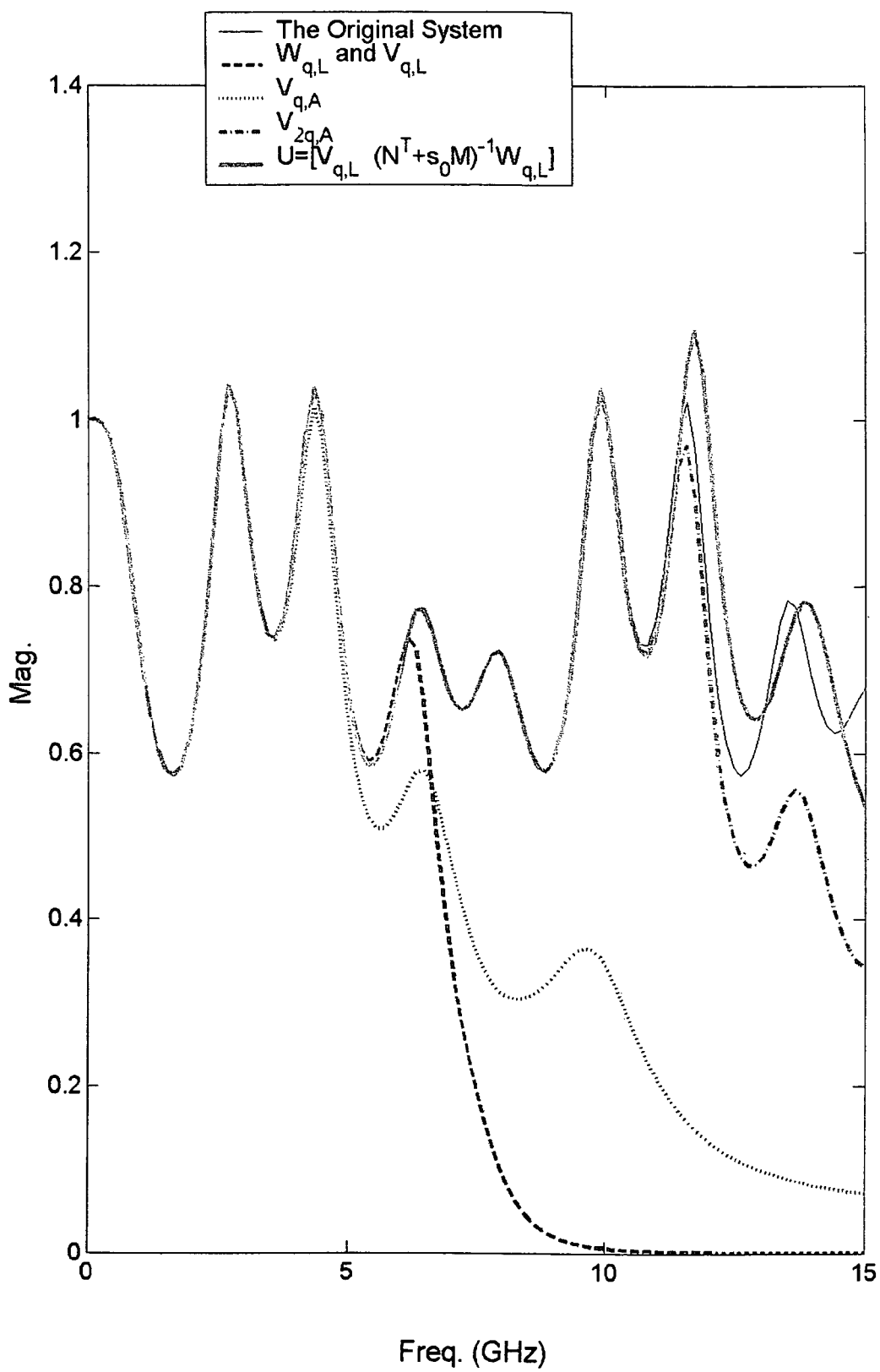
FIG. 2 shows the frequency responses of the voltage Vout in FIG. 1.
Figure 3:
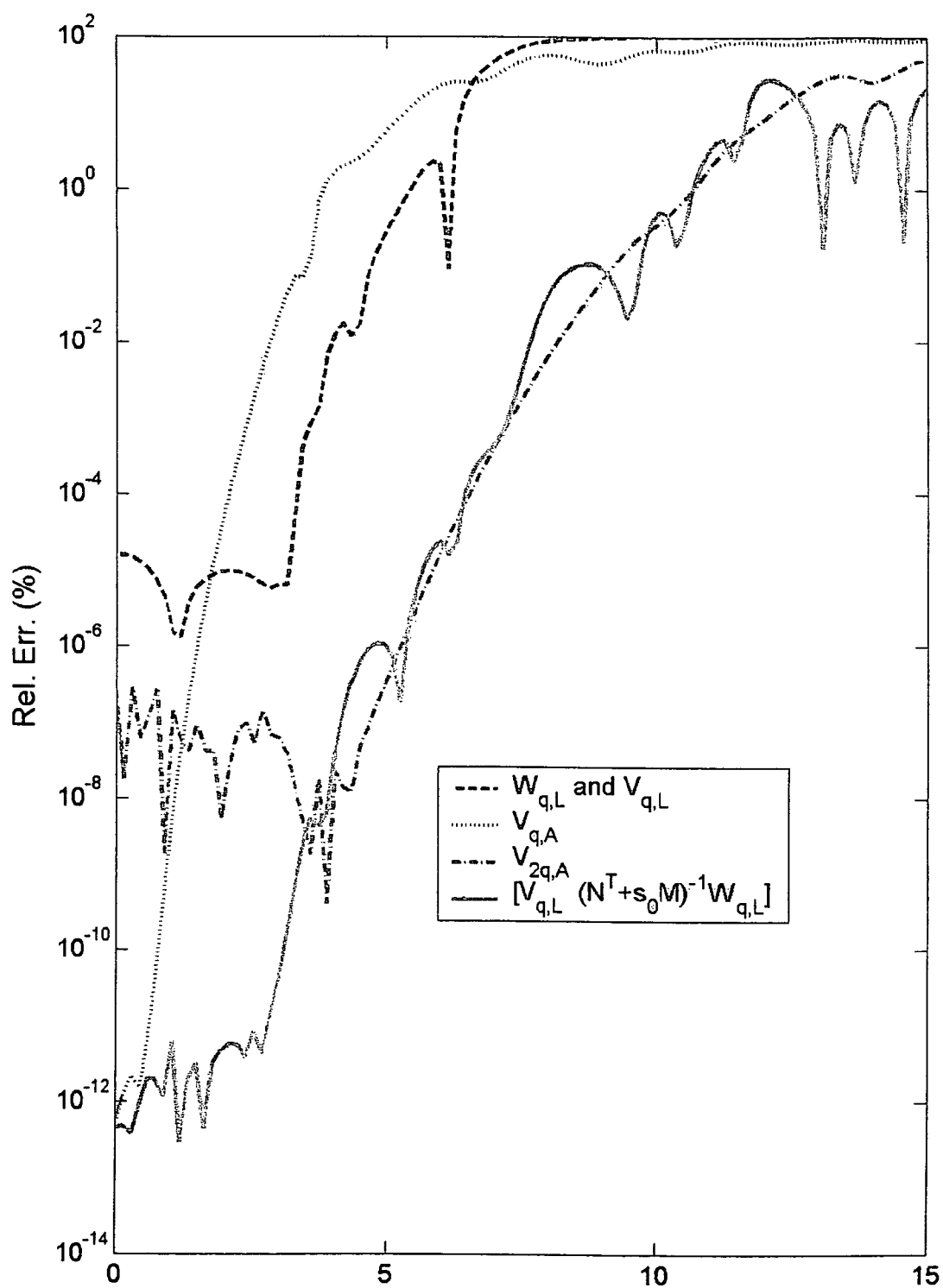
FIG. 3 shows the relative errors in the frequency responses in FIG. 2.

A mesh twelve-line circuit, presented in FIG. 1, is studied to show the efficiency of the proposed method. The line parameters are resistance: 1.0 O/cm, capacitance: 5.0 pF/cm, inductance: 1.5 nH/cm, driver resistance 3 O, and load capacitance: 1.0 pF. Each line is divided into 50 sections. Therefore, the dimension of the MNA matrices is n=1198, m=1, and p=1, and D≠B. We set the expansion frequency $s_0$=1 GHz, the iteration number k=15, and use a total of 1001 frequency points distributed uniformly between the frequency range {0,15 GHz} for simulations. The frequency responses of the original model and the reduced-order model generated by the following projections: (1) $W_{q(L)}$ and $V_{q(L)}$; (2) $V_{q(A)}$; (3) $U=V_{2q(A)}$; (4) $U=[V_{q(L)}(N^T+s_0M)^{-1}W_{q(L)})]$I are compared in FIG. 2. Their corresponding relative error, $|Y(s)-\hat{Y}(s)|/|Y(s)|$, are illustrated in FIG. 3.

The program was implemented in Matlab 6.1 with Pentium IV 2.8 GHz CPU and 1024 MB DRAM. The time to generate each reduced-order model and the corresponding average 1-norm relative error are summarized. The average 1-norm relative error is approximated by $$\left(\sum_{i=1}^{1001} |Y(s_i)-\hat{Y}(s_i)|/|Y(s_i)|\right)/1001.$$

Note that only 60% work is needed to generate the similar frequency response by using the proposed method.

Although the invention has been explained in relation to its preferred embodiment, it is to be understood that many other possible modifications and variations can be made without departing from the spirit and scope of the invention as hereinafter claimed.

REFERENCE

[1] Z. Bai, J. Demmel, J. Dongarra, A. Ruhe, and H. van der Vorst (edc.), *Templates for the Solution of Algebraic Eigenvalue Problems: A Practical Guide*, SIAM, Philadelphia, Pa., 2000.

[2] M. Celik, L. T. Pileggi, and A. Odabasioglu, *IC Interconnect Analysis*, Kluwer Academic Publisher, 2002.

[3] R. W. Freund, "Krylov-subspace methods for reduced-order modeling in circuit simulation," *Journal of Computational and Applied Mathematics*, vol. 123, pp. 395-421, 2000.

[4] P. Feldmann and R. W. Freund, "Efficient linear circuit analysis by Pad_approximation via the Lanczos process," *IEEE Trans. On Computer-Aided Design of Integrated Circuits and Systems*, vol. 14, no. 5, pp. 639-649, 1995.

[5] P. Feldmann and R. W. Freund, "The SyMPVL algorithm and its applications to interconnect simulation," *Proc. 1997 International Conference on Simulation of Semiconductor Processes and Devices*, pp. 1113-116, 1997.

[6] S. Y. Kim, N. Gopal, and L. T. Pillage, "Time-domain macromodels for VLSI interconnect analysis," *IEEE Trans. on Computer-Aided Design of Integrated Circuits and Systems*, vol. 13, no. 10, pp. 1257-1270, 1994.

[7] H. J. Lee, C. C. Chu, and W. S. Feng, "Interconnect modeling and sensitivity analysis using adjoint networks reduction technique," in *Proc. the 2003 International Symposium on Circuits and Systems*, pp. 648-651, Bangkok, Thailand, 2003.

[8] A. Odabasioglu, M. Celik, and L. T. Pileggi, "PRIMA: passive reduced-order interconnect macromodeling algorithm," *IEEE Trans. on Computer-Aided Design of Integrated Circuits and Systems*, vol. 17, no. 8, pp. 645-653, 1998.

[9] L. T. Pillage and R. A. Rohrer, "Asymptotic waveform evaluation for timing analysis," *IEEE Trans. on Computer-Aided Design of Integrated Circuits and Systems*, vol. 9, no. 4, pp. 352-366, 1990.

[10] J. Vlach and K. Singhal, *Computer Methods for Circuit Analysis and Design*, 2nd ed., Van Nostrand Reinhold, 1993.

[11] J. M. Wang, C. C. Chu, Q. Yu, and E. S. Kuh, "On projection based algorithms for model order reduction of interconnects," *IEEE Trans. on Circuits and Systems-I: Fundamental Theory and Applications*, vol. 49, no. 11, pp. 1563-1585, 2002

What is claimed is:

1. A method performed by computer, for reducing the computational complexity and overcoming numerical instability, resulting in faster computation times and less storage space for RLC (Resistor-Inductor-Capacitor) interconnect model-order reduction by performing adjoint networks operations, comprising:

i) establishing an MNA (modified nodal analysis) expression of an original system of a RLC circuit;

ii) creating a matrix A and a vector R from the MNA expression as a base vector for subspace expansion, wherein the matrix A is obtained through $A=-(s_0M+N)^{-1}M$ and the vector R is obtained through $R=(s_0M+N)^{-1}B$;

iii) executing a block Lanczos algorithm between an expansion vector and a system dynamic differences of Krylov subspace to yield first biorthogonal base $V_{q,L}$ and second biorthogonal base $W_{q,L}$;

iv) establishing an adjoint MNA expression:

$$M\frac{dx_a(t)}{dt}=-N^Tx_a(t)+Du(t), y_a(t)=B^Tx_a(t),$$

wherein system moments are represented as $X^{(i)}(s_0)$ and $X_a^{(i)}(s_0)$, with $X^{(i)}(s_0) \in \text{colsp}(V_{q,L})$ and $X_a^{(i)}(s_0) \in \text{colsp}((N^T+s_0M)^{-1}W_{q,L})$;

v) creating an equivalent transformation matrix U using the first biorthogonal base $V_{q,L}$ yielded from the block Lanczos algorithm from the Krylov subspace and the second biorthogonal base $W_{q,L}$ yielded from the block Lanczos algorithm from the Krylov subspace, wherein:

$$U=[V_{q,L}(N^T+s_0 M)^{-1} W_{q,L}], \text{since } \{X^{(i)}(s_0), X_a^{(j)}(s_0)\} \in \text{colsp}(U);$$

vi) obtaining a reduced order MNA matrix utilizing the equivalent transformation matrix U by a model-order reduction with a one sided projection;

vii) obtaining a frequency response waveshape from the reduced order MNA matrix; and viii) outputting the frequency response waveshape by the computer, wherein
  (1) N and M are MNA network matrixes;
  (2) $S_0$ is a frequency expansion point;
  (3) B is nodes connecting interconnects and inputted signals; and
  (4) "t" is time, "u(t)" is a function of an input signal, "x" is a system variable, "y" is an output signal, and "a" is a variable of an adjoint network.

2. A method performed by computer, for reducing the computational complexity and overcoming numerical instability, resulting in faster computation times and less storage space for RLC (Resistor-Inductor-Capacitor) interconnect model-order reduction by performing adjoint networks operations as recited in claim 1, for the reduced MNA matrix with model-order reduction in (v), an output moment is equal to a system moment of previous k+l of the original system, that is, $Y=\hat{Y}^{(i)}(s_0)=Y^{(i)}(s_0)$, wherein
  (1) $Y^{(i)}(s_0)$ is the ith system moment of output signal transfer function; and
  (2) the model-order reduction problem is a q-order system, where q <<n, such that $$\hat{M}\frac{d\hat{x}(t)}{dt} = -\hat{N}\hat{x}(t) + \hat{B}u(t), \hat{y}(t) = \hat{D}^T\hat{x}(t)$$

where $\hat{x}(t) \in R^q, \hat{M}, \hat{N} \in R^{q \times q}, \hat{B} \in R^{q \times m}, \hat{M}=U^T MU, \hat{N}=U^T NU, \hat{B}=U^T B$ and $\hat{D} \in R^{q \times p}$, and the corresponding ith-order system moment and output moment about $s_0$ is $\hat{X}^{(i)}(s_0)=(-(\hat{N}+s_0\hat{M})^{-1}\hat{M})^i(\hat{N}+s_0\hat{M})^{-1}\hat{B}$ and $\hat{Y}^{(i)}(s_0)=\hat{D}^T\hat{X}^{(i)}(s_0)$.

* * * * *